(12) United States Patent
Chow

(10) Patent No.: US 6,992,530 B2
(45) Date of Patent: Jan. 31, 2006

(54) RF AMPLIFIER WITH IMPROVED IMPEDANCE MATCHING

(75) Inventor: Yut Hoong Chow, Penang (MY)

(73) Assignee: Agilent Technologies, Inc., alo Alto, CA (US)

( * ) Notice: Subject to any disclaimer, the term of this patent is extended or adjusted under 35 U.S.C. 154(b) by 0 days.

(21) Appl. No.: 10/406,944

(22) Filed: Apr. 3, 2003

(65) Prior Publication Data

US 2004/0196104 A1    Oct. 7, 2004

(51) Int. Cl.
*H03F 3/04* (2006.01)
(52) U.S. Cl. .................................... 330/288; 330/277
(58) Field of Classification Search .................. None
See application file for complete search history.

(56) References Cited

U.S. PATENT DOCUMENTS 5,164,681 A  * 11/1992 Nishimura .................. 330/288
6,369,658 B1 *  4/2002 Nilson ........................ 330/301
6,617,915 B2 *  9/2003 Rajan ......................... 330/288

FOREIGN PATENT DOCUMENTS

JP            405029845 A   *  2/1993

* cited by examiner

*Primary Examiner*—Khanh V. Nguyen

(57) ABSTRACT

An amplifier having first and second enhancement-mode Field Effect Transistors (FETs) is disclosed. The input port receives an input signal that is to be amplified. The source of the first FET is connected to the input port such that the first FET provides an input impedance match for a signal source connected to the input port. The gate of the second FET is connected to the drain of the first FET such that the second FET amplifies the output signal from the drain of the first FET to provide an amplified input signal. The first and second FETs form a current mirror. An output circuit provides a predetermined output impedance at an output port for coupling the amplified input signal to a circuit that is external to the amplifier. In one embodiment of the invention, the output circuit includes a third FET connected as a source follower with the second FET.

6 Claims, 3 Drawing Sheets

RF AMPLIFIER WITH IMPROVED IMPEDANCE MATCHING

FIELD OF THE INVENTION

The present invention relates to RF amplifiers.

BACKGROUND OF THE INVENTION

Various wireless communication devices such as cellular telephones, radios, and wireless modems require RF amplifiers to amplify the signal received from an antenna or the like. The amplifier must also provide an impedance match to the antenna. Typically, the amplifier is divided into an integrated circuit chip having the transistors and other circuitry associated with the amplifier and a number of off-chip components that filter the signal or provide impedance matching at a particular operating frequency. The integrated circuit amplifiers commonly used have a number of significant problems.

First, the circuits provide good input impedance matching over a relatively small frequency band. In general, the matched band decreases in width as the center frequency of the input band decreases. In principle, this problem can be reduced by utilizing more off-chip matching components. However, such a solution increases the component count, and hence, the manufacturing cost of the amplifier. In addition, the insertion loss imposed by these additional matching components increases, and hence, the net gain of the circuit decreases.

Second, the gain of the amplifier drops rapidly at frequencies outside the matched frequency. Hence, wide band amplifiers are difficult to construct.

Third, the gain of the device typically depends on the gain of a single component. Hence, manufacturing variations in the properties of this component lead to large variations in the gain of the amplifier. In addition, such circuits are prone to instabilities when this single component has high gain.

SUMMARY OF THE INVENTION

The present invention includes an amplifier having first and second enhancement-mode Field Effect Transistors (FETs). The input port receives an input signal that is to be amplified. The source of the first FET is connected to the input port such that the first FET provides an input impedance match for a signal source connected to the input port. The gate of the second FET is connected to the drain of the first transistor such that the second FET amplifies the output signal from the drain of the first FET to provide an amplified input signal. The first and second FETs form a current mirror. An output circuit provides a predetermined output impedance at an output port for coupling the amplified input signal to a circuit that is external to the amplifier. In one embodiment of the invention, the output circuit includes a third FET connected as a source follower with the second FET. In a second embodiment, the output circuit includes a resistor network. A passive impedance matching network may also be included for altering the input impedance of the input port. In one embodiment of the invention, the first, second, and third FETs are located on a single die, and part of the passive impedance network is located off of the die.

DETAILED DESCRIPTION OF THE PREFERRED EMBODIMENTS OF THE INVENTION

Figure 1:
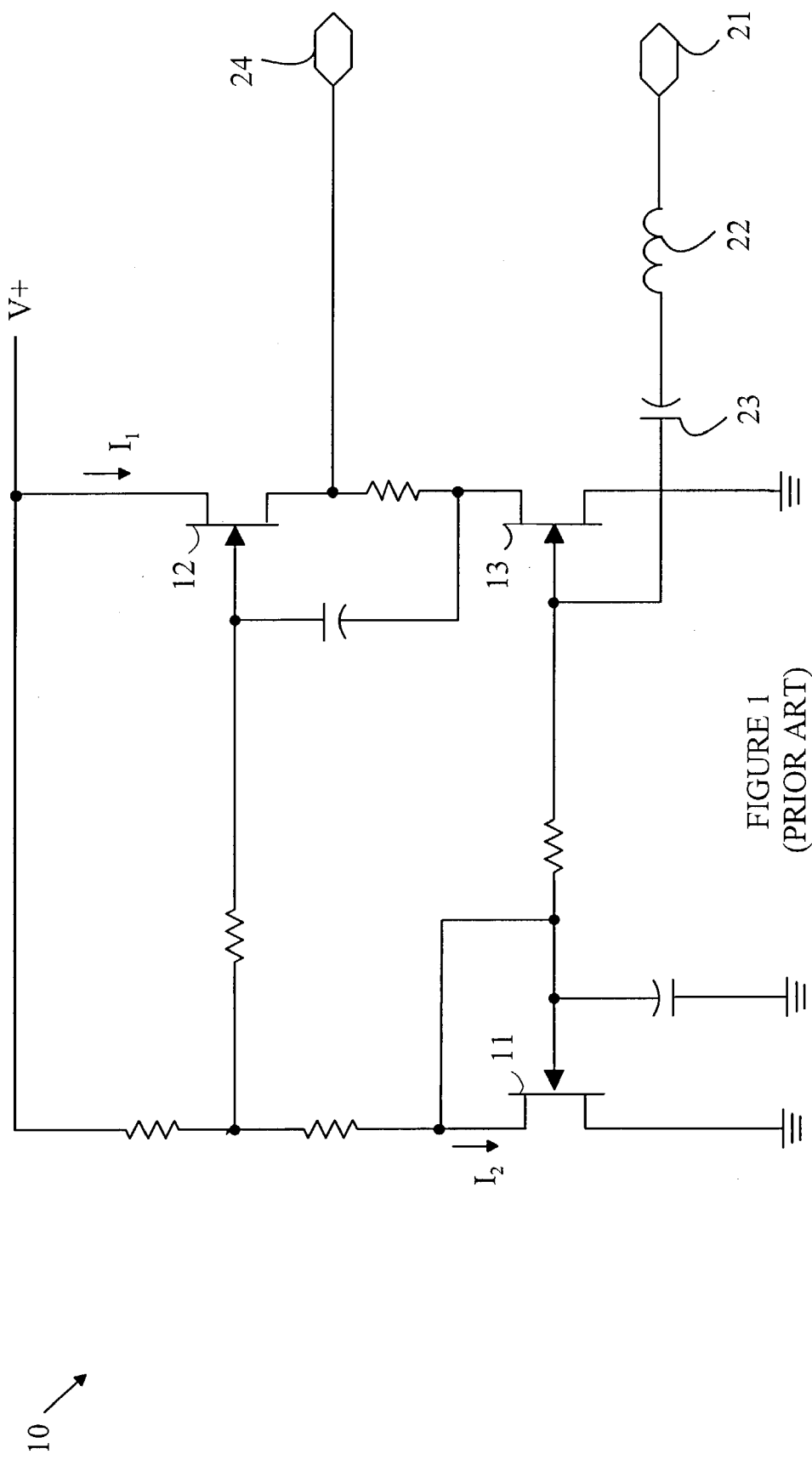
FIG. 1 is a schematic drawing of a typical prior art RF amplifier.

The manner in which the present invention provides its advantages can be more easily understood with reference to a typical prior art RF amplifier. Refer now to FIG. 1, which is a schematic drawing of a prior art RF amplifier 10. Amplifier 10 utilizes an enhancement-mode n-channel FET 13 to provide the gain. FET 12 provides the desired output impedance to output port 24. FETs 12 and 13 are biased by FET 11 that is connected as a current mirror. The bias current through FETs 12 and 13 is approximately the current through FET 11 times the ratio of the channel widths of FETs 13 and FET 11.

The gain of amplifier 10 is a sensitive function of frequency. The input impedance at port 21 is set by inductor 22 and capacitor 23. For example, when the circuit is optimized to provide an input match at 2.4 GHz, amplifier 10 has a bandwidth of 300 MHz and a gain of 22 dB. Unfortunately, the gain at 5.5 GHz drops to 8 dB.

Furthermore, the gain of the amplifier varies with any process variations in FET 13, since all of the gain in amplifier 10 is provided by FET 13. Furthermore, amplifier 10 is prone to unstable operation because of the high gain of FET 13 and the high Q-factor of the circuit.

Figure 2:
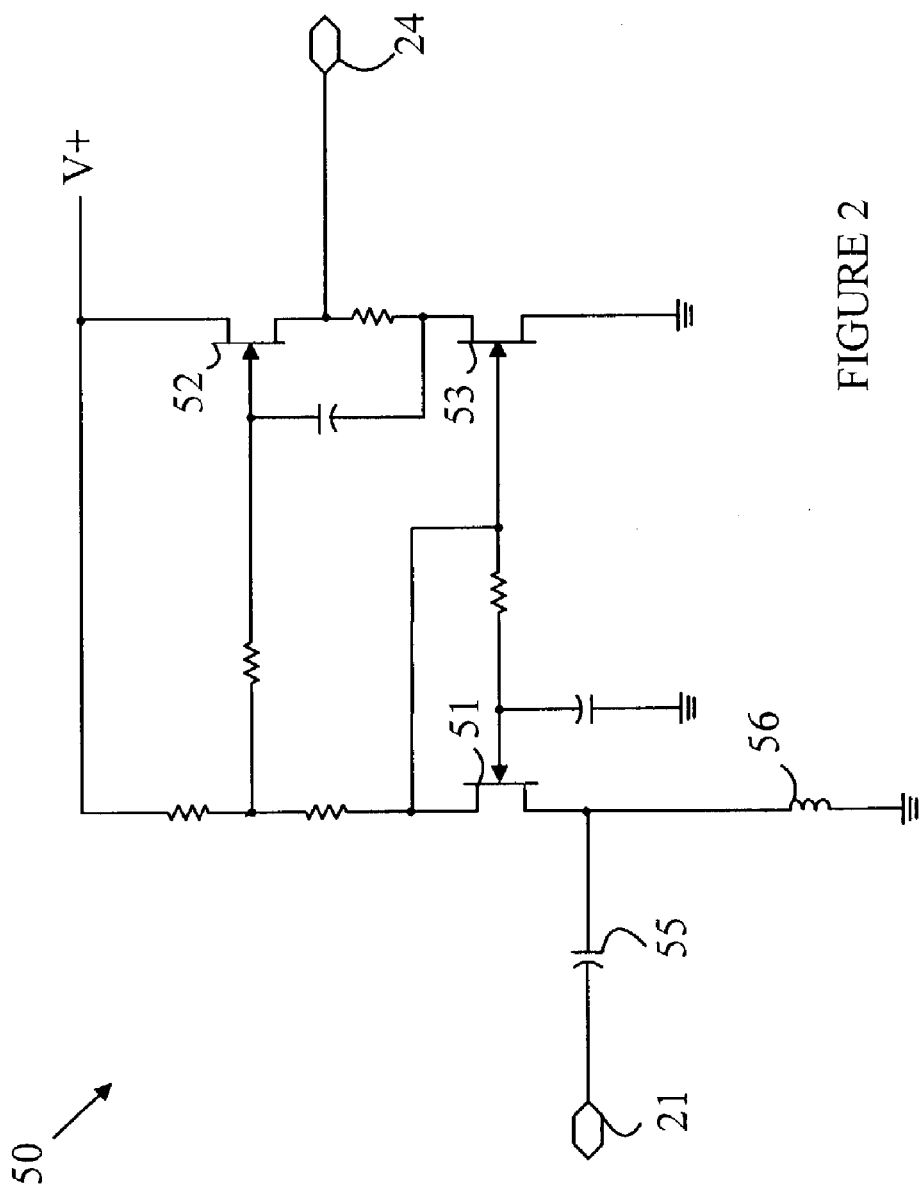
FIG. 2 is a schematic drawing of an amplifier according to one embodiment of the present invention.

The present invention addresses the above problems by replacing the passive impedance matching utilized in amplifier 10 with an active matching circuit and by splitting the gain function between two FETs, thereby reducing the gain needed from any one FET and the sensitivity to process variations in the FETs. Refer now to FIG. 2, which is a schematic drawing of an amplifier 50 according to one preferred embodiment of the present invention. Amplifier 50 also utilizes a current-mirror circuit to bias the main amplification FET. In amplifier 50, FET 51 provides three functions. First, it provides the DC bias for FET 53 in a manner analogous to that described above with reference to amplifier 10. That is, FETs 51 and 53 are connected in a current mirror configuration.

Second FET 51 acts as an active impedance matching device at RF that matches the input signal source connected to port 21, to the gate of FET 53. If inductor 56 provides an impedance that is much larger than the gate-source impedance of FET 51, the input impedance presented at port 21 is approximately $Z_{in}$, where $$Z_{in} = r_s + \frac{1}{g_m} \approx \frac{1}{g_m}$$

Here, $r_s$ is the source input resistance of FET 51 and $g_m$ is the transconductance of FET 51. Typically, $r_s$ is a few tenths of an ohm. Since the transconductance of FET 51 is a function of the drain current and gate width, any real impedance can be matched to the input of FET 51 by varying the current through FET 51 or by varying the gate width of FET 51.

Third, FET 51 also provides gain. Hence, the gain function of the amplifier can be split between FETs 51 and 53. Accordingly, the amount of gain that must be supplied by either FET is reduced.

The input impedance of amplifier 50 can also be varied by varying capacitor 55 and inductor 56 to achieve better matching at a particular frequency. However, unlike the prior art amplifier discussed above, varying these components does not lead to a degradation in the input impedance matching at other frequencies. Finally, it should be noted that the input impedance of amplifier 50 is less sensitive to variations in FET 53 than the prior art circuit discussed above because FET 53 is no longer connected directly to the input port 21.

As noted above, both FET 51 and FET 53 contribute to the gain of amplifier 50. Hence, the gain of each FET can be set to a lower value than in the prior art amplifier discussed above. Accordingly, the instability problems associated with a single high gain FET circuit are substantially reduced in the present invention.

It should also be noted that the present invention utilizes the same number of components as amplifier 10 while achieving an input match over a wide range of frequencies from 1 GHz to 10 GHz. In addition, the gain roll-off is substantially improved. For example, the present invention can provide a gain of 21 db at 2.4 GHz and still have a gain of approximately 12 db at 5.5 GHz.

Figure 3:
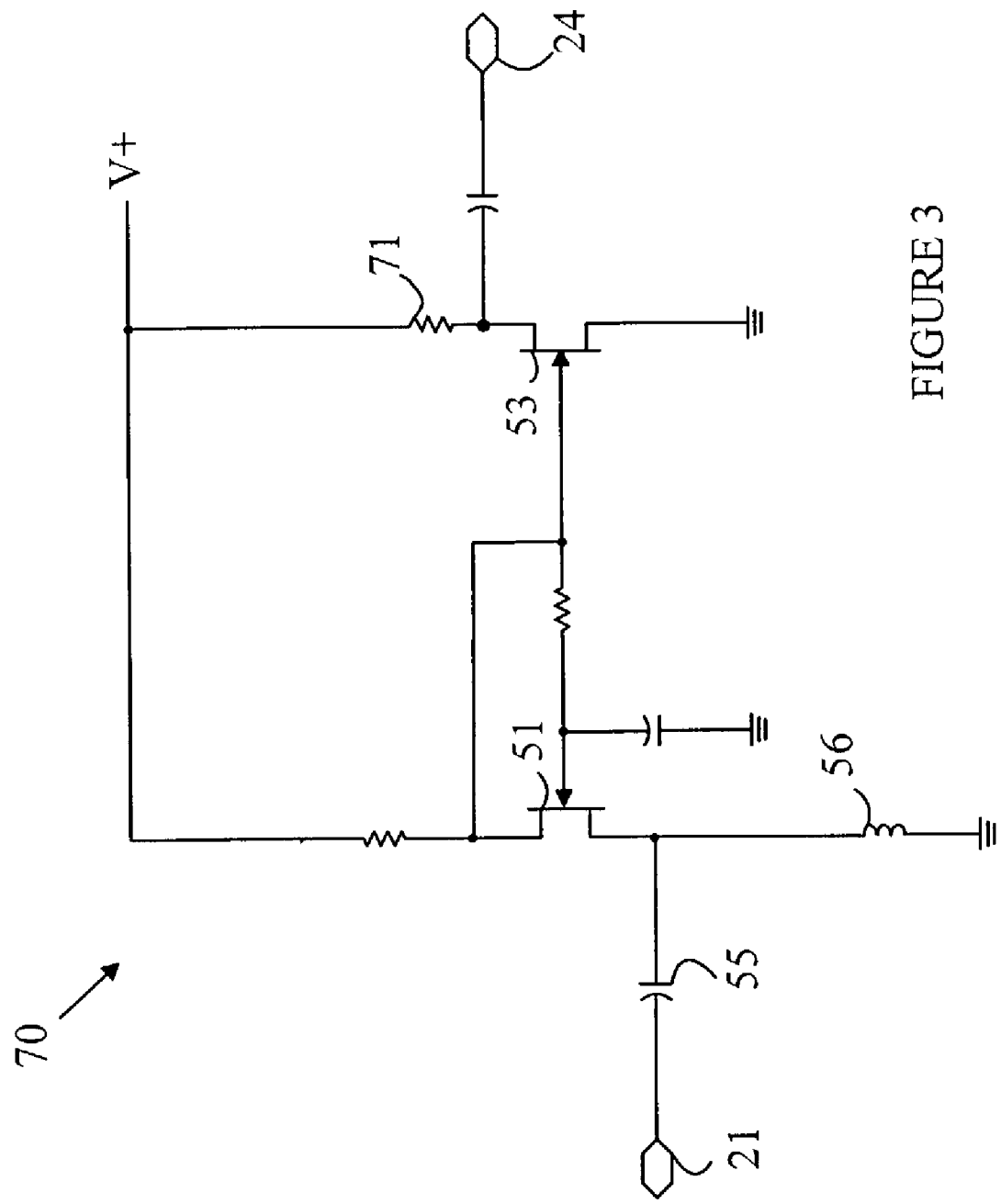
FIG. 3 is a schematic drawing of an amplifier according to another embodiment of the present invention.

The above-described embodiments of the present invention utilize a FET 52 to provide the required output impedance to output port 24. However, other forms of output impedance matching can also be utilized. Refer now to FIG. 3, which is a schematic drawing of an amplifier 70 according to another embodiment of the present invention. To simplify the following discussion, those components of amplifier 70 that provide the same function as components discussed above with respect to amplifier 50 have been assigned the same reference numerals. Amplifier 70 utilizes a resistor connected to one of the power rails to provide the desired output impedance to port 24.

Various modifications to the present invention will become apparent to those skilled in the art from the foregoing description and accompanying drawings. Accordingly, the present invention is to be limited solely by the scope of the following claims.

What is claimed is:

1. An amplifier comprising:
an input port for receiving an input signal;
a first FET having a source, drain, and gate, said source being connected to said input port, said first FET providing an input impedance match for a signal source connected to said input port;
a second FET having a source, drain, and gate, said gate of said second FET being connected to said drain of said first FET, said second FET amplifying an output signal from said drain of said first FET to provide an amplified signal, said first and second FETs forming a current mirror; and
an output circuit for providing a predetermined output impedance at an output port.

2. The amplifier of claim 1 wherein said output circuit comprises a resistor network.

3. The amplifier of claim 1 further comprising a passive impedance matching network for altering the input impedance of said input port.

4. An amplifier comprising:
an input port for receiving an input signal;
a first FET having a source, drain, and gate, said source being connected to said input port, said first FET providing an input impedance match for a signal source connected to said input port;
a second FET having a source, drain, and gate, said gate of said second FET being connected to said drain of said first FET, said second FET amplifying an output signal from said drain of said first FET to provide an amplified signal, said first and second FETs forming a current mirror; and
an output circuit for providing a predetermined output impedance at an output port,
wherein said output circuit comprises a third FET connected as a source follower with said second FET.

5. An amplifier comprising:
an input port for receiving an input signal;
a first FET having a source, drain, and gate, said source being connected to said input port, said first FET providing an input impedance match for a signal source connected to said input port;
a second FET having a source, drain, and gate, said gate of said second FET being connected to said drain of said first FET, said second FET amplifying an output signal from said drain of said first FET to provide an amplified signal, said first end second FETs forming a current mirror;
an output circuit for providing a predetermined output impedance at an output port; and
a passive impedance matching network for altering the input impedance of said input port,
wherein said passive impedance matching network comprises an inductor connected between said source of said first FET and a power rail.

6. An amplifier comprising:
an input port for receiving an input signal;
a first FET having a source, drain, and gate, said source being connected to said input port, said first FET providing an input impedance match for a signal source connected to said input port;
a second FET having a source, drain, and gate, said gate of said second FET being connected to said drain of said first FET, said second FET amplifying an output signal from said drain of said first FET to provide an amplified input signal, said first and second FETs forming a current mirror; and
an output circuit for providing a predetermined output impedance at an output port,
wherein said output circuit comprises a third FET connected as a source follower with said second FET, said amplifier further comprising a passive impedance matching network for altering the input impedance of said input port, and
wherein said first, second, and third FETs are located on a single die, and wherein part of said passive impedance network is located off of said die.

* * * * *